United States Patent [19]
Jyouno et al.

[11] Patent Number: 5,892,713
[45] Date of Patent: Apr. 6, 1999

[54] NONVOLATILE SEMICONDUCTOR MEMORY DEVICE

[75] Inventors: Yusuke Jyouno, Higashi-murayama; Takayuki Kawahara, Higashi-yamato; Katsutaka Kimura, Akishima, all of Japan

[73] Assignee: Hitachi, Ltd., Tokyo, Japan

[21] Appl. No.: 604,748

[22] Filed: Feb. 23, 1996

[30] Foreign Application Priority Data

Feb. 27, 1995 [JP] Japan .................................. 7-038576

[51] Int. Cl.$^6$ ............................................ G11C 16/04
[52] U.S. Cl. .......................... 365/185.11; 365/185.06; 365/185.21; 365/230.03; 365/203
[58] Field of Search .................. 365/185.11, 230.03, 365/203, 204, 185.96, 185.21

[56] References Cited

U.S. PATENT DOCUMENTS

| | | | |
|---|---|---|---|
| 5,014,246 | 5/1991 | Uomatsu et al. ................. | 365/230.03 |
| 5,262,992 | 11/1993 | Uondou .................................. | 365/205 |
| 5,267,214 | 11/1993 | Fujishima et al. ................. | 365/230.03 |
| 5,280,447 | 1/1994 | Hazen et al. ....................... | 365/185.11 |
| 5,301,162 | 4/1994 | Shimizu ............................. | 365/230.03 |
| 5,315,555 | 5/1994 | Choi .................................... | 365/230.03 |
| 5,557,568 | 9/1996 | Miyamoto et al. ................ | 365/185.11 |

*Primary Examiner*—David C. Nelms
*Assistant Examiner*—Hoai Ho
*Attorney, Agent, or Firm*—Antonelli, Terry, Stout & Kraus, LLP

[57] ABSTRACT

The memory mat is divided in two banks, which share the sense & latch circuit. As an example of the circuit operation, the information contained in the memory cells in a block of four bit lines BL11a–BL14a connected to a word line WL1a in the memory array MAa of the bank A is temporarily stored in the sense & latch circuits SL11–SL14. The information of bit lines is latched to the sense & latch circuit SLa through the sub-input/output signal lines IO1a and IO2a by the switches YS1a and YS2a that alternately operates at a cycle two times that of the external clock. The latched information is then output onto the input/output signal line IOa by the switch SWa in synchronism with the clock. After the four bit lines BL11a–SB14a have been read out, the sense & latch circuits SL11–S114 in that block are reset and the bit lines on the bank B are precharged while the information on the bank A is being output. After the reading on the bank A is finished, the word line on the bank B is raised to a high level to execute the read operation in the similar manner. In this way, the word lines on the two banks are alternately raised to the high level for continuous and alternate reading. This configuration provides a nonvolatile semiconductor memory device which allows high-speed block reading.

22 Claims, 9 Drawing Sheets

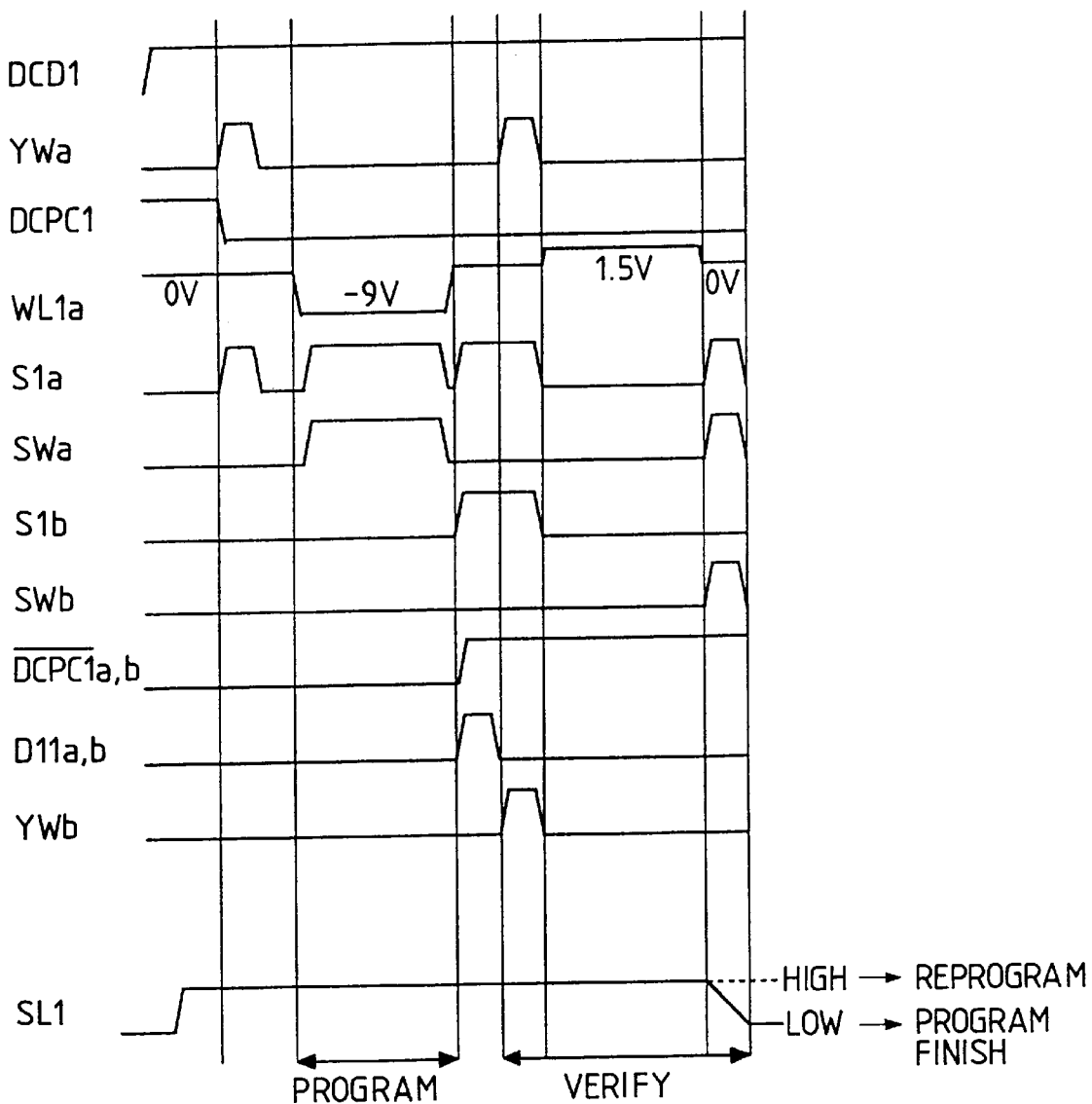

NONVOLATILE SEMICONDUCTOR MEMORY DEVICE

BACKGROUND OF THE INVENTION

1. Field of the Invention

The present invention relates to a nonvolatile semiconductor memory device, and, more particularly, to a nonvolatile semiconductor memory device that can increase the speed of bulk read operations and reduce bit-line pitches for the purpose of increasing the memory capacity.

2. Description of the Prior Art

A conventional nonvolatile semiconductor memory device of this kind, such as flash memory, is described in the 1994 Symposium on VLSI Circuits Digest of Technical Papers, pp.61–62. The operations of this conventional flash memory—(1) read, (2) write and (3) erase—are described by referring to FIG. 9 of the present specification.

FIG. 9 shows an essential circuit of one memory cell connected to a word line and a bit line. In the figure, reference symbol MC represents a memory cell having a floating gate, and 10–17 represent N-channel MOS transistors that perform switching operations (hereinafter referred to simply as NMOS switches). In the following description, each NMOS switch is called by the reference name of a signal line that is connected to its gate for control.

(1) Read Operation

The read operation is performed by checking the current flowing through the memory cell MC to determine whether the memory cell MC is in the "1" or "0" state. In FIG. 9, the voltages of a signal line PRC and a signal line TR are held high to turn on NMOS switches 13, 15 and precharge a bit line BL and a sense & latch circuit SL to a voltage of a common source line VSA, after which the voltages of the signal line PRC and the signal line TR are lowered to turn off the NMOS switches 13, 15.

Next, a word line WL is supplied with a power supply voltage Vcc (not shown) and then three signal lines ST1, ST2 and TR are held high in voltage to turn on the corresponding NMOS switches 10, 11 and 15 to store a voltage change in the bit line BL corresponding to the cell information temporarily in the sense & latch circuit SL provided for each bit line.

Then, an NMOS switch 17 provided on each bit line BL is turned on by a line SW to output the information held in the memory cell MC onto the line 10.

(2) Write Operation

The write operation is performed as follows. First, information "1" or "0" is fed from the line IO through the NMOS switch SW to the sense & latch circuit SL where it is held. When "1" is held in the sense & latch circuit SL, because the NMOS switch 16 is on, the turning on of the NMOS switch PG causes the bit line BL to be precharged to 4 V, the voltage of the common source line VSA. When "0" is held in the sense & latch circuit SL, the NMOS switch 16 remains turned off and the bit line BL is not precharged.

Next, the voltage of the word line WL is set to –9 V and the NMOS switches TR and ST2 are turned on. At this time, the voltage of the bit line connected to the sense & latch circuit SL where information "1" is held is precharged to 4 V, whereas the voltage of the bit line connected to the sense & latch circuit SL where information "0" is held is not precharged and remains 0 V. Hence, the memory cell MC, which is connected to the sense & latch circuit SL where the write information "1" is held, is written with information "1."

Then, an NMOS switch DDC is turned on to connect the bit line BL to a common source V2 to discharge the bit line BL. The bit line BL connected to the sense & latch circuit SL is again precharged by turning on the NMOS switch PG according to whether the information held in the sense & latch circuit SL is "1" or "0". When the information held in the sense & latch circuit SL is "1," the NMOS switch 16 is on, so that the bit line BL is precharged to 1 V again by setting the voltage of a common source VSA to 1 V. When information held is "0," the NMOS switch 16 remains turned off leaving the bit line BL unprecharged.

Next, a verify operation is performed to check if the write operation has been successfully completed. The verify operation sets the voltage of the word line WL to 1.5 V and turns on NMOS switches ST1, ST2 and then NMOS switch TR. When the sense & latch circuit SL holds information "1" and the threshold of the written memory cell MC is lower than 1.5 V, the memory cell MC is turned on by the word line voltage of 1.5 V to lower the voltage of the bit line BL, causing the information "1" held in the sense & latch circuit SL to change to "0." This is taken as a verification that the information was written into the memory cell MC, thus terminating the write operation on the memory cell MC. If, after the write operation, the threshold of the memory cell MC is found to be equal to or greater than 1.5 V, the information "1" held in the sense & latch circuit SL remains as is. This causes the write and verify operations on the memory cell MC to be repeated until the threshold of the memory cell MC becomes lower than 1.5 V and the information held in the sense & latch circuit SL changes from "1" to "0."

(3) Erase Operation

The erase operation is performed one word line at a time. The voltage of the word line WL is set at 12 V, the substrate (not shown) is applied with 4 V, the signal line ST1 for NMOS switch 10 is set to the power supply voltage Vcc, the common source line V1 connected to the source of the NMOS switch 10 is set to –4 V, the gate voltages of the NMOS switches DDC, ST2 are set to 0 V, and the voltage of the common source line V2 connected to the source of the NMOS switch DDC is set to 0 V. This operation causes the bit line BL to float, thus performing the erase operation.

In FIG. 9, a signal line SET is used to turn on or off an NMOS switch 18 that drives the sense & latch circuit SL.

Further, the conventional flash memories have yet to employ a DC-based correction measure for flaws caused by shorting of bit lines.

The above-mentioned conventional flash memory has a configuration whereby the read operation is performed one word line at a time, i.e., after one word line has been read out, the sense & latch circuit is reset to discharge the bit line and the sense circuit and then the bit line and the sense & latch circuit are precharged again before the next word line is selected for reading. This operation is repeated for all word lines successively to read the contents of the memory, so that as the memory capacity increases the time taken for precharging and discharging increases, making it more difficult to perform the read operation at high speed.

In the configuration in which a sense & latch circuit is provided for each bit line, as in the conventional flash memory, there is a problem that while the miniaturization of memory cells for increased memory capacity reduces the layout interval of bit lines, the sense & latch circuits cannot be reduced in size by as much as are the pitches of the bit lines.

Further, although a DC-based flaw correction measure needs to be prepared to deal with defects that are caused by shortcircuiting between reduced-interval bit lines as the miniaturization of memory cells progresses, the conventional flash memories have yet to use such a correction measure.

It is therefore a primary object of this invention to provide a nonvolatile semiconductor memory device, which allows fast reading of a large-capacity memory and which can easily accommodate a DC-based flaw correction measure designed to correct defects such as caused by shortcircuits between bit lines whose intervals have decreased with miniaturization of memory cells.

Another object of this invention is to provide a nonvolatile semiconductor memory device, which can reduce the pitches of the sense & latch circuits to miniaturize memory cells for increased capacity of memory and can easily accommodate a DC-based flaw correction measure designed to repair defects such as caused by shortcircuits between bit lines whose intervals have decreased with miniaturization of memory cells.

SUMMARY OF THE INVENTION

To achieve the above objectives, the present invention divides the memory mat into two banks, which share one set of amplification and information holding means, i.e., the sense & latch circuits, which are arranged so that they can be operated independently for each block. At the same time, this invention performs the read operation in synchronism with the external clock. This arrangement increases the speed of the read operation.

In this invention there are provided a plurality of blocks, each comprising a plurality of bit line pairs and one sense & latch circuit, thus allowing the reduction in the bit line pitches.

Each block is provided with a power switch for the sense & latch circuits, a power switch for the precharge circuit, and a switch for discharging. These switches are also used for a DC-based remedy to deal with defects caused by shortcircuits between the bit lines that occur as the memory size is reduced. These means to realize the above objectives are described in more detail as follows.

The nonvolatile semiconductor memory device of this invention, as shown in FIG. 1, comprises at least: a plurality of word lines; a plurality of bit lines; a memory array comprising a plurality of memory cells arranged at intersections between the word lines and the bit lines and each having a floating gate; and a plurality of amplification and information holding means, for example, sense & latch circuits, to amplify and hold signals on the bit lines; wherein a memory mat including the memory array is divided into a first bank and a second bank, the bit lines belonging to the first bank BL11a, . . . BLn4a and the bit lines belonging to the second bank BL11b, . . . BLn4b combine to form pairs of bit lines so that each pair of bit lines shares one of the sense & latch circuits, and switch means are provided which selectively control blocks, each of which comprises the bit line pairs BL11a and BL11b, . . . BLn4a and BLn4b and the same number of sense & latch circuits SL11, . . . SLn4 as that of the bit line pairs.

In the nonvolatile semiconductor memory device of the embodiment shown in FIG. 1, the switch means to selectively control the blocks comprise: switches DCPC1, . . . DCPCn to selectively control circuits, one block at a time, that are connected to a power supply line PP for supplying an electric charge when precharging the bit lines; switches /DCPC1a, . . . /DCPCna, /DCPC1b, . . . /DCPCnb to selectively discharge the bit lines one block at a time; and switches DCD1, . . . DCDn to selectively turn on or off the power supply of the amplification and information holding means one block at a time.

In this case, the following arrangement is preferred. That is, as shown in FIG. 1, each of the banks has first and second sub-input/output IO1a,b, IO2a,b lines connected parallelly to output amplification and information holding means, i.e., output sense & latch circuits SLa,b, through switch means, i.e., switches YS1a, YS2a,b, that operate at a cycle two times that of an external clock, the output sense & latch circuits are connected to the output line IOa,b of each bank through an output switching means SWa,b that operates a half-cycle out of phase with the external clock, the first sub-input/output line IO1a,b of each bank is parallelly connected to a first set of sense & latch circuits of each block through switching means S11a, S13a, . . . Sn1b, Sn3a, S11b, S13b, . . . Sn1b, Sn3b that operate in synchronism with the external clock, and the second sub-input/output line IO2a,b is parallelly connected to a second set of sense & latch circuits of each block through switching means S12a, S14a, . . . Sn2a, Sn4a, S12b, S14b, . . . Sn2b, Sn4b that operate in synchronism with the external clock.

Further, it is preferred that, at the same time that information of memory cells connected to one word line which is stored in the first set of the sense & latch circuits connected to the first sub-input/output line IO1a,b is output from the output line IOa,b of the bank through the output sense & latch circuit SLa,b, information of memory cells connected to the same word line which is stored in the second set of sense & latch circuits connected to the second sub-input/output line IO2a,b be saved in the output sense & latch circuit SLa,b.

The first set of sense & latch circuits is a set of odd-numbered sense & latch circuits SL11, SL13, SLn1, SLn3 in each block, and the second set of sense & latch circuits is a set of even-numbered sense & latch circuits SL12, SLI4, . . . SLn2, SLn4 in each block.

It is also preferred that while the information of memory cells connected to a word line in one bank, e.g., word line WL1a in FIG. 1, is output from the output line IOa for the bank A, a word line WL1b for the other bank B is being selected.

In this case, the above operation is preferably performed in synchronism with the external clock.

The nonvolatile semiconductor memory device of another embodiment of this invention, as shown in FIG. 4, comprises at least: a plurality of word lines; a plurality of bit lines; a memory array comprising a plurality of memory cells arranged at intersections between the word lines and the bit lines and each having a floating gate; and a plurality of amplification and information holding means, i.e., sense & latch circuits, to amplify and hold signals on the bit lines; wherein a memory mat including the memory array is divided into a read side memory mat MAa and a reference mat MAb, the bit lines BL11a, . . . BLn4a belonging to the read side memory mat MAa and the bit lines BL11b, . . . BLn4b belonging to the reference mat MAb combine to form pairs of bit lines, and switching means are provided which selectively control blocks, each of which comprises a plurality of the bit line pairs BL11a and BL11b, . . . BLn4a and BLn4b and one sense & latch circuit SL1, . . . SLn.

Further, the switching means to selectively control the blocks comprise, as shown in FIG. 4, switches DCPC1, . . . DCPCn to selectively control circuits, one block at a time, that are connected to a power supply line Vcc for supplying an electric charge when precharging the bit lines; switches /DCPC1a, . . . /DCPCna, /DCPC1b, . . . /DCPCnb to selectively discharge the bit lines one block at a time; and switches DCD1, . . . DCDn to selectively turn on or off the power supply of the sense latch circuits one block at a time.

In the above nonvolatile semiconductor memory device, the following configuration is preferred. That is, a first signal selection means, i.e., a signal line selection circuit 30 of FIG. 8 including address buffer 21, fuse ROM 22, AND circuit 23 and decoder 24, is provided one for every two or more blocks to selectively cut off the selective block control switching means belonging to a block that has a conduction failure with bit lines due to faulty connection or foreign matters.

The nonvolatile semiconductor memory device may further comprise a spare memory mat which has word lines commonly connected to the word lines of the first and second banks, and a second signal line selection means-the signal line selection circuit 31 including compare circuit 25, fuse ROMs 26, 27, AND circuit 28 and decoder 29 as shown in FIG. 8—which selects the switching means DCPC1, . . . DCPCn, /DCPC1a, . . . /DCPCna, /DCPC1b, . . . /DCPCnb, DCD1, . . . DCDn that selectively control blocks in the spare memory mat, each block comprising a plurality of bit line pairs and the same number of sense & latch circuits as that of the bit line pairs, e.g., four bit line pairs BL11a and BL11b, . . . BL14a and BL4b and four sense & latch circuits SL11, . . . SL14 as in the memory mat of FIG. 1.

Alternatively, as shown in FIG. 8, the nonvolatile semiconductor memory device may further comprise a spare memory mat RM which has word lines commonly connected to the word lines of the read side memory mat and the reference mat, and a signal line selection circuit 31 which selects the switching means that selectively control blocks in the spare memory mat, each block comprising a plurality of bit line pairs and one amplification and information holding means.

In this case, the switch means to selectively control the blocks in the spare memory mat comprise as shown in FIG. 7(b): switches DCPC to selectively control circuits, one block at a time, that are connected to a power supply line Vcc to supply an electric charge to the bit lines for precharging; switches /DCPCa, /DCPCb to selectively discharge the bit lines one block at a time; and switches DCD to selectively turn on or off the power supply of the sense & latch circuit SL one block at a time.

Function

With the nonvolatile semiconductor memory device of this invention, the memory mat including the memory array is divided into a first bank and a second bank, the bit lines belonging to the first bank and the bit lines belonging to the second bank combine to form pairs of bit lines so that the paired bit lines share each sense & latch circuit, and switch means are provided which selectively control blocks, each of which comprises the bit line pairs and the same number of sense & latch circuits as that of the bit line pairs. Because of this configuration, it is possible to precharge the bit lines of a block connected to the word lines of the second bank while the information of the memory cells connected to the word lines of the first bank is being read out.

Because the switching means to selectively control the blocks comprise switches to selectively control circuits, one block at a time, that are connected to a power supply line to supply an electric charge to the bit lines for precharging, switches to selectively discharge the bit lines one block at a time, and switches to selectively turn on or off the power supply of the amplification and information holding means one block at a time, it is possible to repair, one block at a time, defects as caused by shortcircuits between the bit lines, as described later.

Each of the banks has first and second sub-input/output lines connected parallelly to output sense & latch circuits through switch means that operate at a cycle two times that of an external clock, the output sense & latch circuits are connected to the output line of each bank through an output switching means that operates half-cycle out of phase with the external clock, the first sub-input/output line of each bank is parallelly connected to a first set of sense & latch circuits of each block through switching means that operate in synchronism with the external clock, and the second sub-input/output line is parallelly connected to a second set of sense & latch circuits of each block through switching means that operate in synchronism with the external clock. This arrangement allows the information of the memory cells connected to the word line of each bank to be read out in synchronism with the external clock.

At the same time that information of memory cells connected to one word line which is stored in the first set of the sense & latch circuits connected to the first sub-input/output line is output from the output line of the bank through the output sense & latch circuits, information of memory cells connected to the same word line which is stored in the second set of sense & latch circuits connected to the second sub-input/output line is saved in the output sense & latch circuits. This configuration allows the information of the memory cells connected to one word line to be read out at high speed in synchronism with the external clock.

Because the first set of sense & latch circuits is a set of odd-numbered sense & latch circuits in each block and the second set of sense & latch circuits is a set of even-numbered sense & latch circuits in each block, it is possible to read the information of the memory cells connected to the same word line successively in synchronism with the external clock at high speed.

Further, the banks are operated alternately every word line so that, while the information of memory cells connected to a word line in one bank is output from the output line for the bank, a word line for the other bank is selected. This operation allows the block reading of memory to be performed at high speed without a delay due to precharging and discharging of the bit lines. Particularly, when this operation is performed in synchronism with the external clock signal, the speed of the block reading performed in synchronism with the external clock can be increased.

In this way, the memory reading in blocks can be made faster than in the conventional method by performing a series of read operations, from the address generation to reading, in synchronism with the external clock, by switching the two banks that share one set of sense & latch circuits, each capable of operating independently, and by reading information from one word line at a time.

The memory mat including the memory array is divided into a read side memory mat and a reference mat, the bit lines belonging to the read side memory mat and the bit lines belonging to the reference mat combine to form pairs of bit lines, and switching means are provided which selectively control blocks, each of which comprises a plurality of the bit line pairs and one amplification and information holding means. This makes it possible to reduce the bit line pitches, the requirement for the miniaturization of memory cells for increased memory capacity.

In this case, too, the switching means to selectively control the blocks comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time. This arrangement makes it possible to repair memory defects, such as shortcircuits of bit lines, one block at a time, as described in the following.

The first signal selection means is provided one for every two or more blocks to selectively cut off the selective block control switching means belonging to a block that has a conduction failure with bit lines due to faulty connection or foreign matters. This arrangement makes it possible to cut off abnormal current flowing through the power supply line into a block of memory cells connected to the failed bit lines and to prevent the memory cell block in question from being selected when the memory cells connected to the failed bit lines are addressed.

The nonvolatile semiconductor memory device is further provided with a spare memory mat which has word lines commonly connected to the word lines of the first and second banks, and a second signal line selection means which selects the switching means that selectively control blocks in the spare memory mat, each block comprising a plurality of bit line pairs and the same number of amplification and information holding means as that of the bit line pairs. With this arrangement, when memory cells in a failed block are addressed, the corresponding memory cells in a block in the spare memory mat are selected in stead of the memory cells in the failed block.

Likewise, the nonvolatile semiconductor memory device is provided with a spare memory mat which has word lines commonly connected to the word lines of the read side memory mat and the reference mat, and a second signal line selection means which selects the switching means that selectively control blocks in the spare memory mat, each block comprising a plurality of bit line pairs and one amplification and information holding means. With this arrangement, when memory cells in a failed block are addressed, the corresponding memory cells in a block in the spare memory mat are selected in stead of the memory cells in the failed block. That is, two or more bit lines and one corresponding sense & latch circuit are combined to form a block. In the event of a failure such as an abnormal drop of power supply voltage due to shortcircuit of bit lines, the power switch for the sense & latch circuit, the power switch for the precharge circuit provided for each block, and the switch for discharging the bit lines are turned off to repair the defective memory by replacing the failed block of memory with a corresponding block in the spare memory mat.

In this case, the switch means to selectively control the blocks in the spare memory mat comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time. This arrangement allows the switch means to function as a power supply switch for the spare memory block.

BRIEF DESCRIPTION OF THE DRAWINGS

FIG. 6 is a timing chart showing an example of write operation as performed by the circuit of FIG. 4;

DESCRIPTION OF THE PREFERRED EMBODIMENTS

Figure 1:
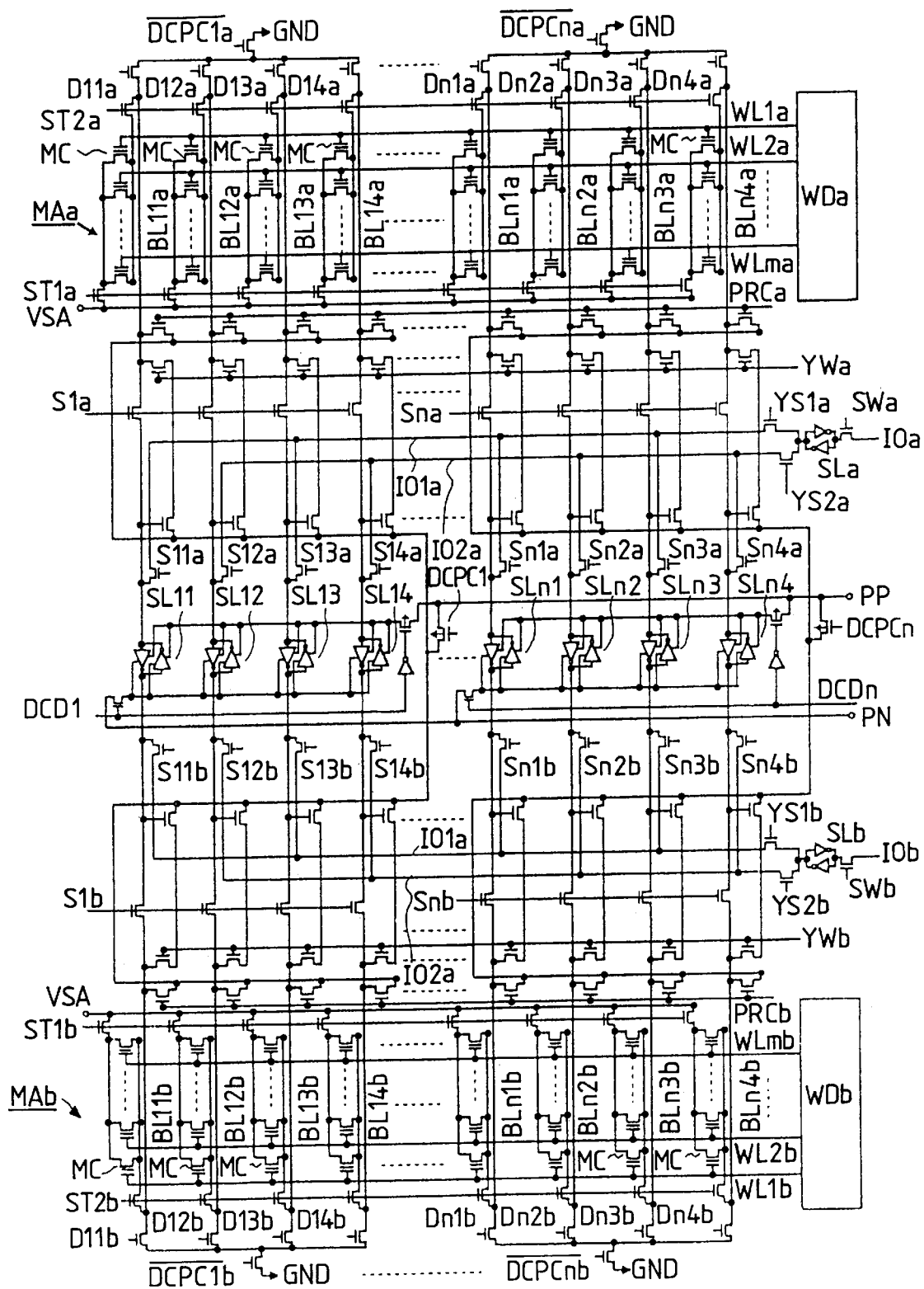
FIG. 1 is an essential part of the circuit of the nonvolatile semiconductor memory device as one embodiment of this invention.

Now, embodiments of the nonvolatile semiconductor memory device according to this invention are described in detail by referring to the accompanying drawings. Complementary signals shown in the drawings to have a line over the reference symbol are, in the following description, given a stroke symbol "/" before the reference symbol.

Embodiment 1

FIG. 1 shows an essential part of the circuit of the nonvolatile semiconductor memory device as one embodiment of this invention. In the figure, the memory mat is divided into two banks A and B, and subscripts a and b attached at the end of the reference symbols for signal lines indicate that they are associated with the bank A and the bank B, respectively.

In the figure an external clock and an external clock pickup circuit are not shown (a general external clock circuit for a synchronous DRAM may be used). As described later, this embodiment increases the speed of read operations by switching between the banks A and B for each word line in synchronism with the external clock.

As shown in FIG. 1, the bank A has 4n bit lines BL11a, . . . BLn4a and m word lines WL1a, . . . WLma. Similarly, the bank B has 4n bit lines B111b, . . . BLn4b and m word lines WL1b, . . . WLmb. At intersections between the bit lines and the word lines there are provided memory cells MC with floating gates, whose drains are connected to the bit lines through NMOS switch ST2a or ST2b, whose sources are connected to the common source VSA through NMOS switch ST1a or ST1b, and whose control gates are connected to the word lines. Hence, the banks A, B have memory arrays MAa, MAb consisting of 4n columns and m rows of memory cells MC located at the intersections between 4n bit lines and m word lines.

Then, connections are made so that a sense & latch circuit SL11 is shared by the bit line BL11a of the bank A and the bit line BL11b of the bank B, that a sense & latch circuit SL12 is shared by the bit line BL12a and the bit line BL12b and that a sense & latch circuit SLn4 is shared by the bit line BLn4a and the bit line BLn4b. Switches DCD1, . . . DCDn, numbering n, are provided to drive or reset four sense & latch circuits simultaneously as one block. The switches DCD1, . . . DCDn each comprise an NMOS switch and a p-channel MOS transistor switch (PMOS switch) connected through an inverter.

In the figure, n PMOS switches DCPC1, . . . DCPCn, n NMOS switches /DCPC1a, . . . /DCPCna on the bank A, and n NMOS switches /DCPC1b, . . . /DCPCnb on the bank B are switches provided to precharge and discharge four bit lines at a time and also used for DC-based correction. NMOS switches D11a, D12a, . . . Dn4a and NMOS switches D11b, D12b, . . . Dn4b, each numbering 4n and provided on each bank, are switches to discharge bit lines connected thereto. NMOS switches PRCa, PRCb are used to precharge the bit lines during the read operation. NMOS switches YWa; YWb are used to precharge the bit lines during the write operation.

In the memory cells on the bank A, they are connected so that the information of the selected memory cells MC which is temporarily held in the sense & latch circuits SL11, . . . SLn4 on the corresponding bit line is, in the case of memory cells on the bank A, output onto an input/output signal line IOa through NMOS switches S11a, S12a, . . . Sn4a, S1a, . . . Sna, YS1a, YS2a, SWa that operate in synchronism with the external clock CLK. In the case of memory cells on the bank B, the memory cell information temporarily stored in the sense & latch circuits is output onto an input/output signal line IOb through NMOS switches S11b, S12b, . . . Sn4b, S1b, . . . Snb, YS1b, YS2b, SWb that operate in synchronism with the external clock CLK. Designated WDa is a word decoder on the bank A and WDb a word decoder WDb on the bank B.

In the nonvolatile semiconductor memory device of this embodiment with the above-mentioned structure, the (1) read operation, (2) write operation and (3) erase operation are performed as follows.

(1) Read Operation

Figure 2:
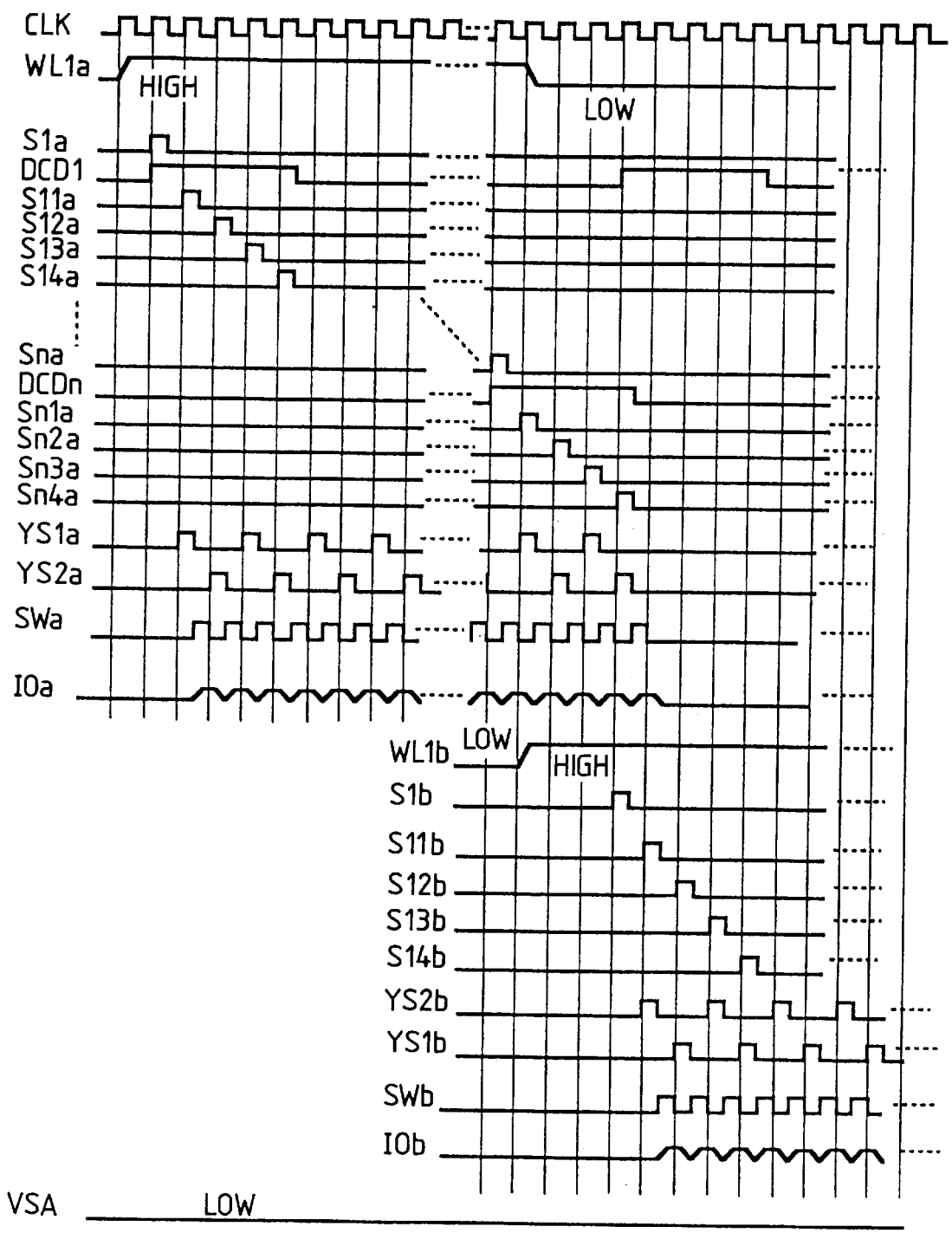
FIG. 2 is a timing chart showing an example of read operation as performed by the circuit of FIG. 1.

The memory read operation is explained by referring to the operation timing chart of FIG. 2. As to the order in which the word lines are read, the word line WL1a of bank A is first read, followed by the word line WL1b of bank B, which in turn is followed by WL2a, WL2b, . . . WLma, WLmb in that order, with the word lines of the two banks selected and read alternately. Though not shown in the timing chart of FIG. 2, the NMOS switch PRCa, n PMOS switches DCPC1, . . . DCPCn, and NMOS switch ST2a are first closed or turned on to precharge all the bit lines on the bank A.

Next, the NMOS switch PRCa and the PMOS switches DCPC1, . . . DCPCn are opened or turned off. Then, the common source VSA is set to 0 V, the NMOS switch ST1a is closed, and the word line WL1a is selected by the word decoder WDa and raised to the power supply voltage Vcc or high level. The NMOS switches ST1a, ST2a are opened after the reading of bank A is finished. In synchronism with the leading edge of the next external clock CLK, the NMOS switch S1a is closed and at the same time the switch DCD1 is closed to drive the four sense & latch circuits SL11, SL12, SL13, SL14 to cause the information contained in the memory cells MC connected to the four bit lines BL11a, BL12a, BL13a, BL14a on the bank A to be stored in the sense & latch circuits SL11, SL12, SL13, SL14 temporarily. The NMOS switch S1a is opened at the trailing edge of the external clock CLK and the switch DCD1 remains closed. In the following explanation, it is understood that the NMOS switches are closed or opened at the leading or trailing edge of the external clock CLK.

In synchronism with the next external clock CLK, the NMOS switches S11a, YS1a are closed to allow the information held in the sense & latch circuit SL11 to be sent through the sub-input/output signal line IO1a to the sense & latch circuit SLa where it is held temporarily. The NMOS switch SWa operates a half cycle out of phase with the external clock CLK and, when the NMOS switches S11a, YS1a are opened, closes to cause the information contained in the memory cell MC connected to the intersection between the word line WL1a and the bit line BL11a to be output through the input/output signal line IOa. At the same time, the NMOS switches S12a, YS2a are closed to send the information held in the sense & latch circuit SL12 to be sent through the sub-input/output signal line IO2a to the sense & latch circuit SLa where it is held temporarily. Immediately after this, the NMOS switch SWa closes to output this information to the external circuit through the input/output signal line IOa.

In synchronism with the next external clock CLK, the information held in the sense & latch circuit SL13 is sent through the sub-input/output signal line IO1a connected with the NMOS switch S13a, YS1a to the sense & latch circuit SLa where it is held. The NMOS switches YS1a, YS2a operate at a cycle two times the external clock CLK to send the information of the memory cell MC to the sense & latch circuit SLa.

At the same time that the NMOS switches S14a, YS2a open and that the information held in the fourth sense & latch circuit SL14 is sent through the sub-input/output signal line IO2a to the sense & latch circuit SLa, the drive switch DCD1 for the sense & latch circuits SL11, SL12, SL13, SL14 opens to reset the four sense & latch circuits SL11, SL12, SL13, SL14.

In this way, by synchronizing the switch operations with the external clock CLK, it is possible to successively output the information of the memory cells MC connected to the word line WL1a. Because the memory cells MC are nonvolatile memory cells with a floating gate, the information contained in the memory cells is not erased by the read operation, thus obviating the need for the refresh operation of writing the memory cells again after the read operation as is required by the synchronous DRAM (Dynamic Random Access Memory).

Further, while the bank A is being output, the NMOS switch PRCb on the bank B is closed and the switch for the sense & latch circuits in the block that has already output the information to the input/output signal line IOa, in this cage, the PMOS switch DCPC1, is closed to precharge the four bit lines BL11b, . . . BL14b and four sense & latch circuits SL11, . . . SL14.

At the trailing edge of the word line WL1a of the bank A, the word line WL1b of the bank B is selected by the word decoder WDb and raised to high level. This allows the switches S1b, DCD1, . . . DCDn, S11b, . . . Sn4b, YS1b, YS2b, SWb to be operated in the same way as in the sequence of operations on the bank A described above, thereby outputting the information of memory cells connected to the word line WL1b to the external circuit through the sub-input/output lines IO1b, IO2b and the input/output signal line IOb. Precharging the bit lines on the bank A at this time allows the information contained in memory cells connected to one word line on the bank A to be output immediately after the output of the bank B.

In this way, the operation of the switches are performed in synchronism with the external clock CLK and the two banks are alternated for each word line. This method increases the speed of reading the large-capacity memory. During the read operation, the common source lines VSA and PN are held low, in this case 0 V, and the common source line PP is set to 1 V. The NMOS switches D11a, . . . Dn4a, D11b, . . . Dn4b are turned off.

(2) Write Operation

Figure 3:
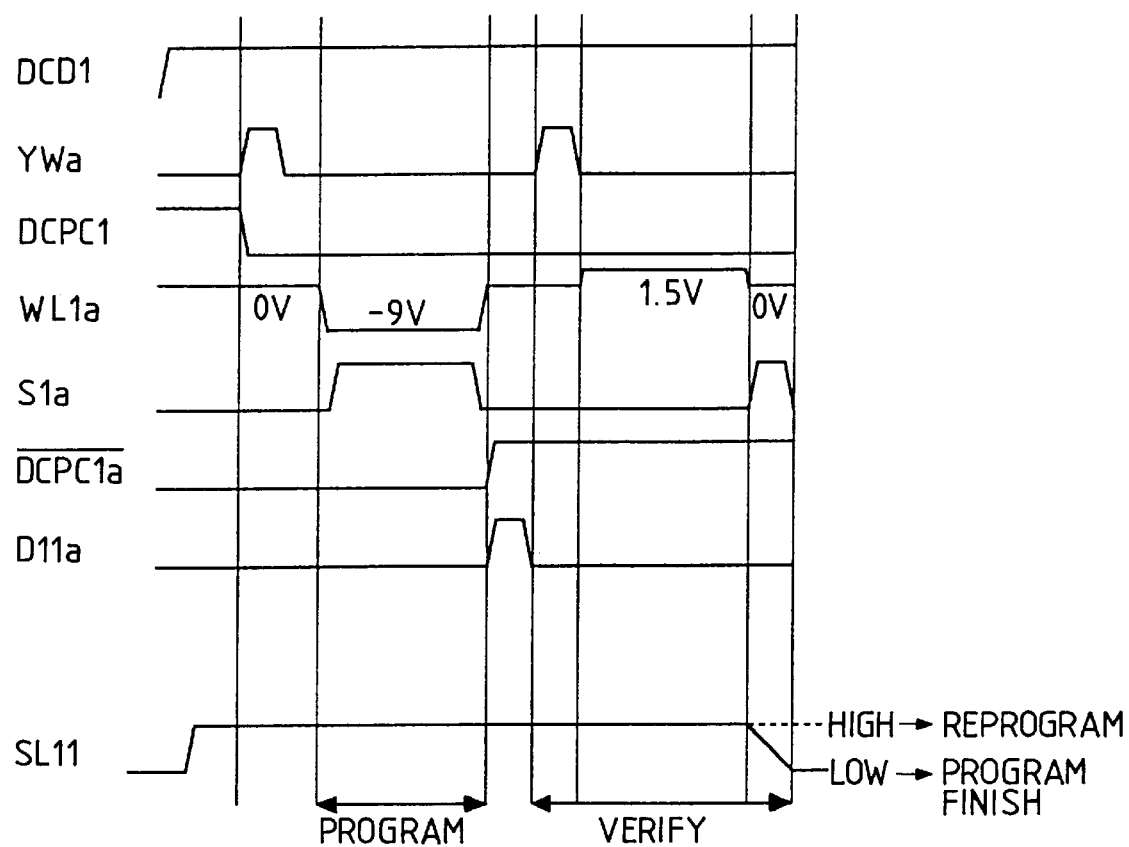
FIG. 3 is a timing chart showing an example of write operation as performed by the circuit of FIG. 1.

Next, the write operation on the circuit of FIG. 1 is explained by referring to FIG. 3, which is a timing chart showing the operation of the switches and the selected word lines during the write operation. The write operation is performed one word line at a time. When writing into the bank A, the information is written through the input/output signal line IOa and the sub-input/output signal line IO1a or IO2a. When information is written into the bank B, it is done through the input/output signal line 1ob and the sub-input/output signal line IO1b or IO2b.

An example case of writing into the memory cell MC connected to the word line WL1a on the bank A is explained in the following. Before the write operation is performed, the word line to be written into is subjected to the erase operation.

First, the switches DCD1, . . . DCDn are closed to drive the sense & latch circuits SL11, . . . SLn4, and the NMOS switches SWa, S11a, . . . Sn4a, YS1a or YS2a are closed to cause the information to be held in the sense & latch circuits SL11, . . . SLn4 corresponding to the bit lines connected to the memory cells MC that are to be written into. When the write operation is to be performed on the memory cells MC connected to the bit line BL11a, the NMOS switches YWa and ST2a and PMOS switch DCPC1 are closed to precharge to 4 V of the common source line PP a block of four bit lines including the bit line BL11a.

Next, the NMOS switch S1a is closed, the common source VSA is set to 0 V, the NMOS switch ST1a is closed, the word line WL1a selected by the word decoder WDa is applied a −9 V, and other nonselected word lines WL2a, . . . WLma are set to 0 V.

Then, the NMOS switches D11a and /DCPC1a are closed to discharge the bit line BL11a, after which the NMOS switch D11a is opened and the NMOS switches YWa and ST2a are closed to precharge the bit line BL11a to 1 V, the voltage of the common source line PP. The word line WL1a is raised to, say, 1.5 V, the common source line VSA is set to 0 V, and the NMOS switch S1a is opened to perform the verify operation to check the write operation according to the threshold of the memory cell MC. In this verify operation, if the threshold of the memory cell MC that was written into is higher than 1.5 V and the write operation is determined not successful, the write operation is performed again. The write and verify operations are repeated until the threshold of the memory cells MC becomes lower than 1.5 V and the information held in the sense & latch circuit SL11 changes from high to low level.

(3) Erase Operation

The erase operation of the circuit shown in FIG. 1 is explained. The erase operation is performed one word line at a time. An example case of erasing the memory cells MC connected to the word line WL1a is described. The word line WL1a selected by the word decoder WDa is applied 12 V, the substrate (not shown) is applied −4 V, the nonselected word lines WL2a, . . . WLma are applied 0 V, and the common source line VSA is applied −4 V. After this, the NMOS switch ST1a is closed to apply −4 V to the source of the memory cells MC. At this time, the threshold of the erased memory cells MC becomes sufficiently higher than 1.5 V.

The nonvolatile semiconductor memory device of this embodiment can easily accommodate a DC-based correction measure designed to remedy defects caused by shortcircuits between bit lines. The DC-based correction measure will be detailed later in connection with the third embodiment.

Embodiment 2

Figure 4:
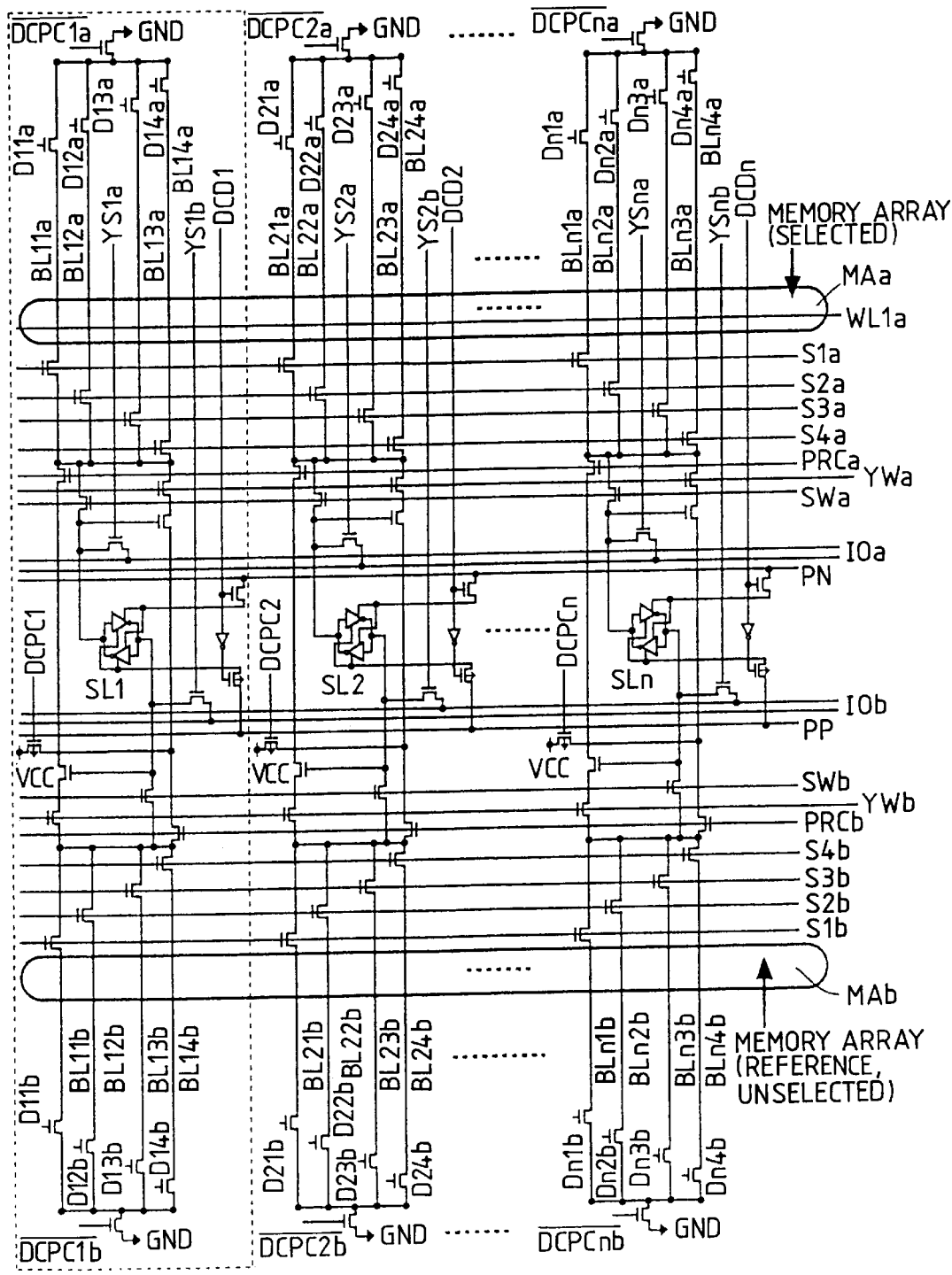
FIG. 4 is an essential part of the circuit of the nonvolatile semiconductor memory device as another embodiment of this invention.

FIG. 4 shows an essential part of the circuit of the nonvolatile semiconductor memory device as another embodiment of this invention. This embodiment has a configuration suited for reducing the bit line pitches. In FIG. 4, reference symbols MAa, MAb represent memory arrays that have the same configuration as the memory arrays MAa, MAb of FIG. 1 with floating gates, which are arranged in 4n columns and m rows. In this embodiment, the subscript a at the end of the reference symbols of signal lines and switches in FIG. 4 indicates that they belong to the memory mat on the read side and the subscript b indicates that they belong to the reference mat.

In this embodiment, one sense & latch circuit is provided for four bit lines for the purpose of narrowing the pitches of the bit lines. For example, a part enclosed by a dotted line in FIG. 4 is taken as one block. This block includes four pairs of bit lines BL11a and BL11b, BL12a and BL12b, BL13a and BL13b, and BL14a and BL14b and a sense & latch circuit SL1 corresponding to these. The switch DCD1 consists of an NMOS and a PMOS whose gates are interconnected through an inverter and whose terminals at one end are connected to the common sources PN, PP, respectively. The switch DCD1 drives and resets the sense & latch circuit SL1. The four pairs of bit lines are connected on the read side with NMOS switches S1a, S2a, S3a, S4a, respectively, and on the reference side with NMOS switches S2b, S2b, S3b, S4b, respectively, to switch the connection between the bit line pairs and the sense & latch circuit. The memory cell information is sent to the sense & latch circuit SL1 through the bit line pairs and the NMOS switches controlled by the signal lines SWa, SWb. An NMOS switch YS1a is used to output the information temporarily held in the sense & latch circuit SL1 onto the input/output signal line IOa. NMOS switches PRCa, PRCb are used to precharge the bit lines during the read operation. A PMOS switch DCPC1 connected at one terminal to the power supply voltage Vcc is used to precharge the bit lines and also used when a DC-based correction is required. An NMOS switch YWa is a switch to precharge the bit lines during the write operation and an NMOS switch YWb is used to precharge the bit lines during the verify operation. Denoted WL1a is a Word line, which, though only one of them is shown, consists of m word lines WL1a, . . . WLma as in the memory array of FIG. 1. Although FIG. 4 shows a configuration in which the sense & latch circuit is provided for every four bit lines, it is possible to provide it for every two or eight bit lines.

The nonvolatile semiconductor memory device of this embodiment is a so-called block erase type flash memory, comprising n blocks described above. The operations—(1) read operation, (2) write operation and (3) erase operation—performed on the flash memory with the above-mentioned configuration are described below.

(1) Read Operation

Figure 5:
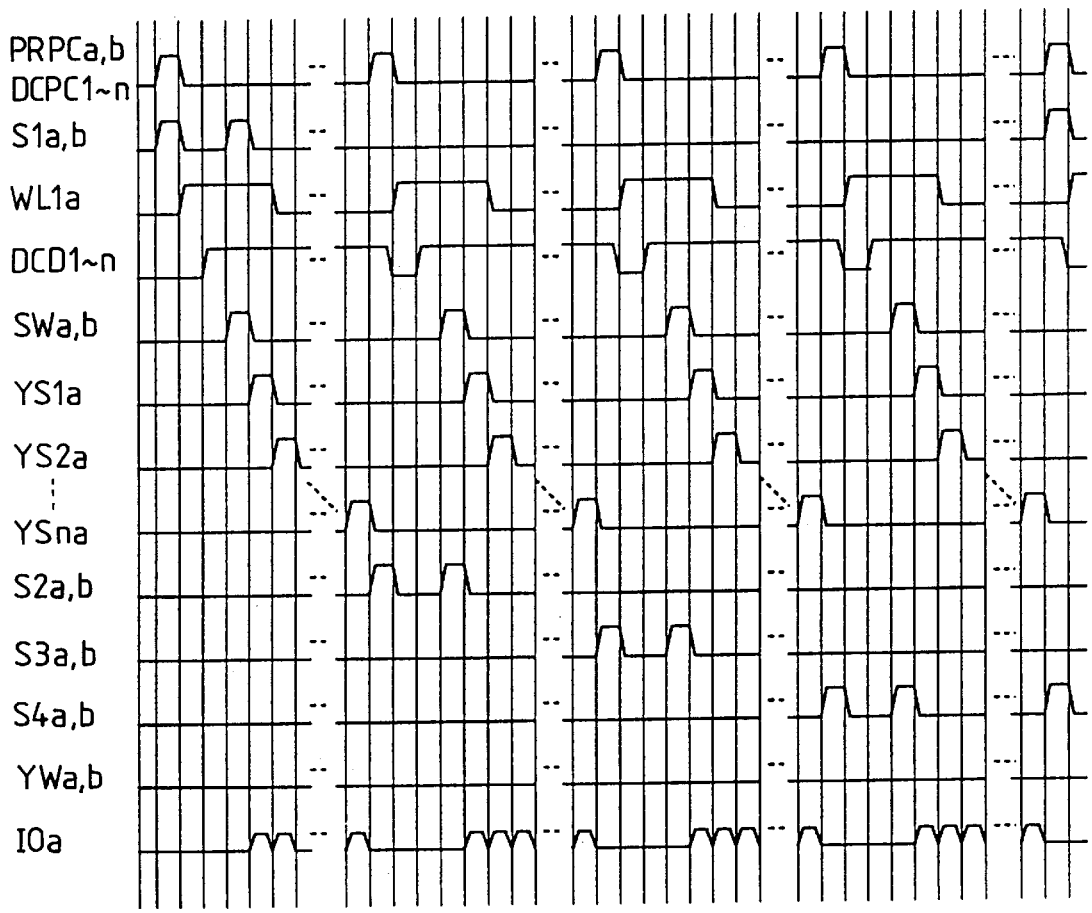
FIG. 5 is a timing chart showing an example of read operation as performed by the circuit of FIG. 4.

The read operation is explained by referring to the timing chart of FIG. 5. The read operation on 4n memory cells (not shown) on a selected word line WL1a in the memory array MAa on the read side is performed as follows.

First, the NMOS switches S1a, S1b are closed to precharge the first bit line pairs BL11a and BL11b, BL21a and BL21b, . . . BLn1a and BLn1b of each block to the power supply voltage Vcc. NMOS switches PRCa, PRCb and PMOS switches DCPC1, DCPC2, . . . DCPCn are closed. After these switches are opened, the selected word line WL1a is raised to the power supply voltage Vcc and switches DCD1, DCD2, . . . DCDn are closed to drive the sense & latch circuits SL1, SL2, . . . SLn.

Next, the NMOS switches S1a, S1b, SWa, SWb are closed to cause the information contained in the memory cells connected to the bit line BL11a to be held temporarily in the sense & latch circuit SL1 according to the potential difference between the paired bit lines BL11a and BL11b. Similarly, the information of memory cells connected to the bit lines BL21a, . . . BLn1a is held temporarily in the sense & latch circuits SL2, . . . SLn.

After this, the NMOS switches YS1a, YS2a, YSna are closed in that order to output the information of each memory cell onto the input/output signal line IOa. At this time, the voltages for all word lines are lowered. After the NMOS switch YSna is closed to output the information contained in the memory cells connected to the bit line BLn1a onto the input/output signal line IOa, the second bit line pairs for each block BL12a and BL22b, BL22a and BL22b, . . . BLn2a and BLn2b are precharged by closing the NMOS switches S2a, S2b, NMOS switches PRCa, PRCb and PMOS switches DCPC1, DCPC2, . . . DCPCn. After these switches are opened, the word line WL1a is again raised to the power supply voltage Vcc. At the same time, the switches DCD1, DCD2, . . . DCDn are opened to temporarily reset the sense & latch circuits SL1, SL2, . . . SLn, after which the switches DCD1, DCD2, . . . DCDn are closed to drive the sense & latch circuits SL1, SL2, . . . SLn again.

Next, the NMOS switches S2a, S2b, SWa, SWb are closed to cause the information contained in the memory cells connected to the bit lines BL12a, BL22a, BLn2a to be temporarily saved in the sense & latch circuits SL1, SL2, . . . SLn, respectively.

After this, the NMOS switches YS1a, YS2a, YSna are closed in that order to output the information of the memory cells onto the input/output signal line IOa. In the same way, the sequence of operations that involves lowering the voltage of the word line WL1a, raising it to the power supply voltage Vcc, and resetting and driving the sense & latch circuits SL1, SL2, . . . SLn is repeated to open and close the NMOS switches S3a and S3b, S4a and S4b, thereby outputting the information of the memory cells connected to the third bit lines BL13a, BL23a, . . . BLn3a and the fourth bit lines BL14a, BL24a, . . . BLn4a of each block in that order.

(2) Write Operation

Next, the write operation is explained by referring to the timing chart of FIG. 6 that shows the operation of each switch. The write operation is performed one word line at a time and the information to be written into the memory cells is temporarily saved in the sense & latch circuit provided for each block. Here we take an example case of writing into the memory cells connected to the selected word line WL1a and the bit line BL11a on the read-side memory array MAa. Before the write operation is performed, the selected word line WL1a is subjected to the erased operation described later.

First, the switch DCD1 and the PMOS switch DCPC1 are closed to drive the sense & latch circuit SL1 to cause the write information to be supplied from the input/output signal line IOa through the NMOS switch YS1a to the sense & latch circuit SL1 where it is held.

Next, the NMOS switches S1a, YWa are closed, the bit line BL11a is precharged to the power supply voltage Vcc, the word line WL1a selected by the word decoder not shown is applied −9 V, and the NMOS switches SWa, S1a are closed.

Then, the NMOS switches SWa, S1a are opened and the NMOS switches /DCPC1a, D11a are closed to discharge the bit line BL11a.

After these switches are opened, the verify operation is performed by first closing the NMOS switches YWa, YWb, S1a, S1b to precharge the bit lines BL11a and BL11b to 1 V, raising the word line WL1a to, say, 1.5 V, and then closing the NMOS switches SWa, SWb, S1a, S1b. If the threshold of the memory cells written into is found in this verify operation to be higher than 1.5 V and the write operation is determined not successful, the write operation is performed again. The write and verify operations are repeated until the threshold of the memory cells becomes lower than 1.5 V and the information held in the sense & latch circuit SL1 changes from high to low level.

(3) Erase Operation

The erase operation is performed one word line at a time. When, for example, the memory cells connected to the word line WL1a are to be erased, the operation involves applying 12 V to the selected word line WL1a, 0 V to nonselected word lines, −4 V to the substrate (not shown), and −4 V to the source side of the memory cells. In this case, the threshold of the erased memory cells becomes sufficiently higher than 1.5 V.

As mentioned above, because the flash memory of this embodiment employs a configuration that uses one sense & latch circuit for a plurality of bit lines, it is possible to realize narrower pitches of bit lines on the layout, the requirement for the reduction in the size of memory cells.

The flash memory of this embodiment, too, can easily accommodate a DC-based correction measure to repair defects caused by shortcircuits between bit lines. The DC-based correction measure will be detailed later in connection with the third embodiment.

Embodiment 3

FIG. 7 shows still another embodiment of the nonvolatile semiconductor memory device according to this invention. In this embodiment, we will explain about the DC-based correction measure to repair defects caused by shortcircuits between bit lines. In FIG. 7, for the sake of simplicity, the components identical with those of the second embodiment shown in FIG. 4 are given like reference symbols and their explanations are omitted.

Figure 7A:
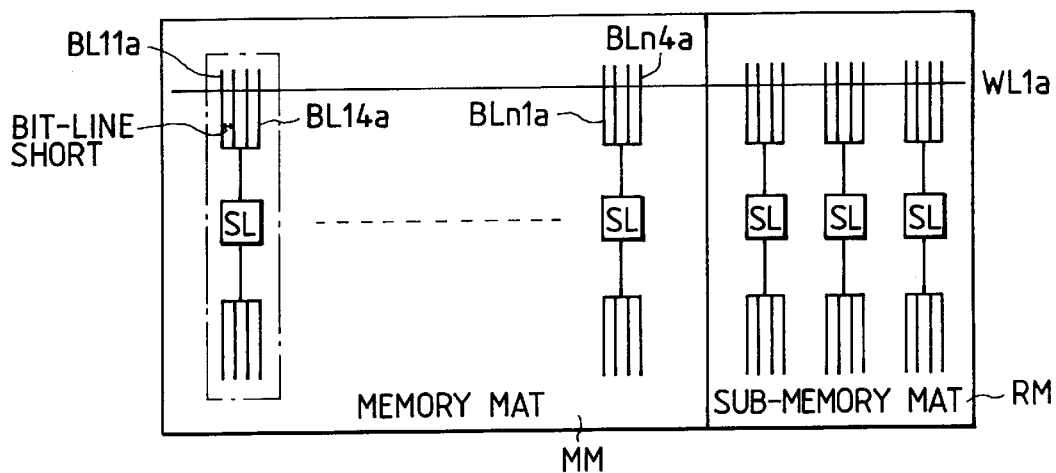
FIGS. 7a and 7b are circuit diagrams showing still another embodiment of the nonvolatile semiconductor memory device according to this invention, with (a) showing a schematic configuration of the device and (b) showing an essential part of the circuit of the block enclosed by a one-dot line in FIG. 7(a)
Figure 7B:
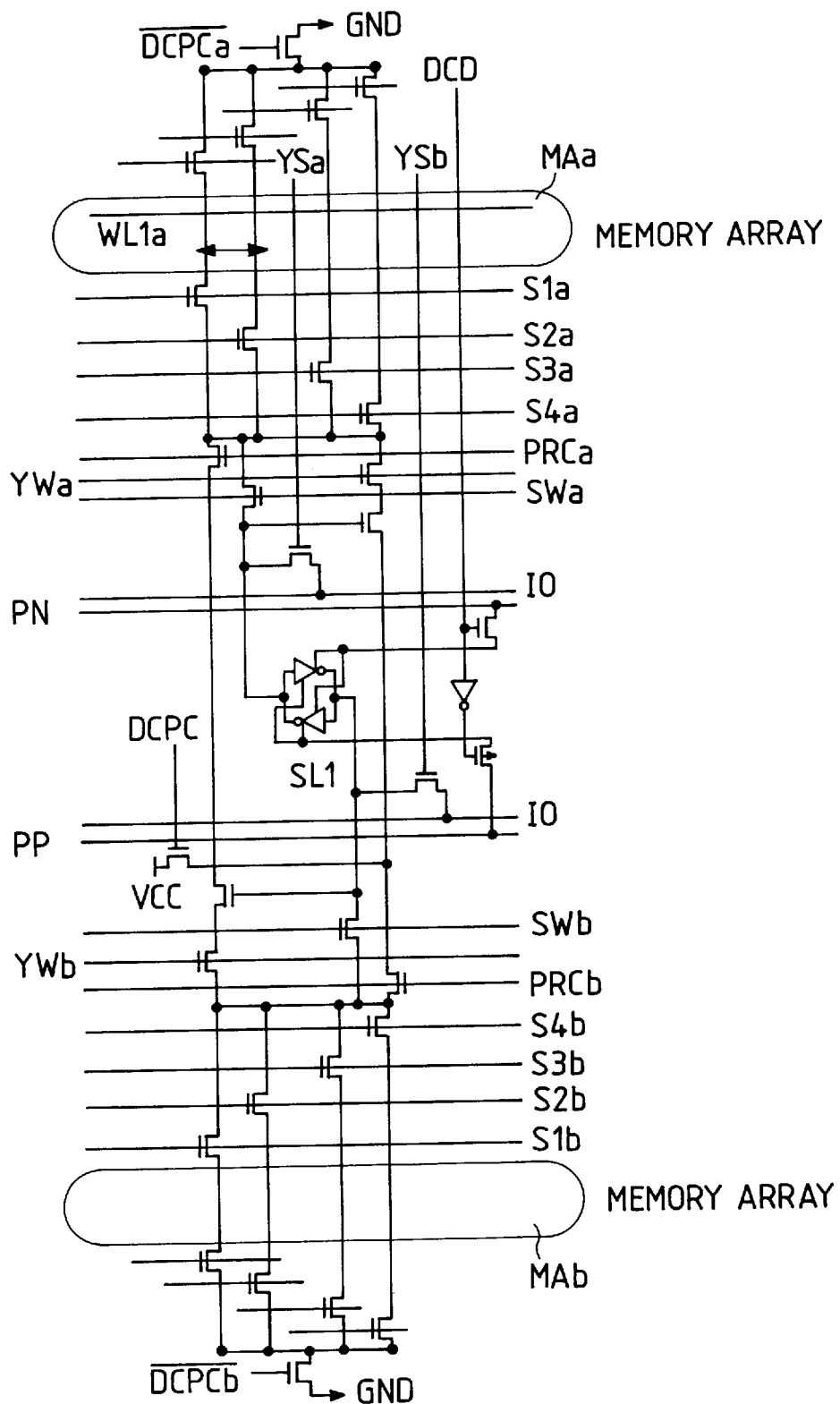
Figure 9:
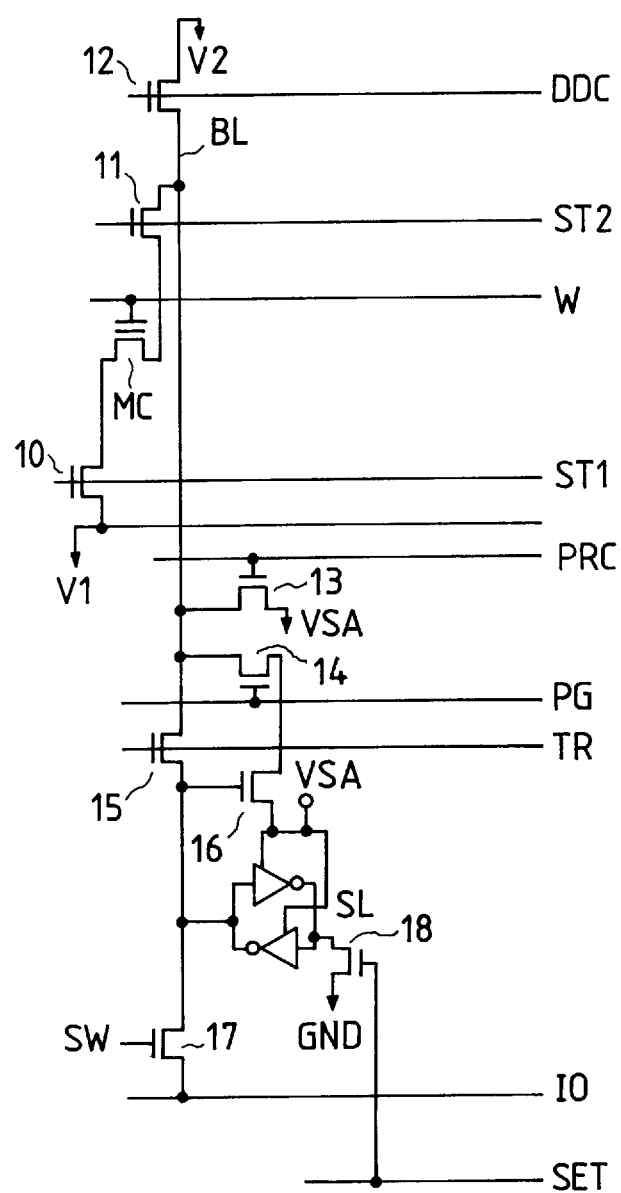
FIG. 9 is an essential part of the circuit of a conventional flash memory.

As shown in the schematic block diagram of FIG. 7(a), the flash memory of this embodiment resembles the second embodiment of FIG. 4 in that one sense & latch circuit SL is shared by four bit lines in each block on the memory array MAa side and on the memory array MAb side. The flash memory has a memory mat MM comprising many such blocks. It, however, differs from the second embodiment in that the flash memory of the third embodiment has a spare memory mat RM consisting of several blocks for the DC-based correction. FIG. 7(b) is a circuit showing the block enclosed by a one-dot line of FIG. 7(a) in which a defect is caused by a shortcircuit between bit lines (indicated by a double-sided arrow).

When bit lines are shorted, they cannot be precharged, causing a drop in the supply voltage and resulting in a failure to perform correct read and write operations. Such a failure is remedied by this embodiment as described below.

In the circuit shown in FIG. 7(b), when the addresses are specified for the memory cells in the memory array MAa that are connected to the shorted bit line to read the information contained in these memory cells, four switches—a switch DCD to drive the sense & latch circuit SL1, a PMOS switch DCPC to supply an electric charge for precharging the bit lines, and NMOS switches /DCPCa, /DCPCb used to discharge the bit lines—are opened, i.e., turned off, to replace the block, which consists of four pairs of bit lines including the shorted bit lines and the sense & latch circuit, with a block inside the spare memory mat RM. The failed block is not used thereafter.

Figure 8:
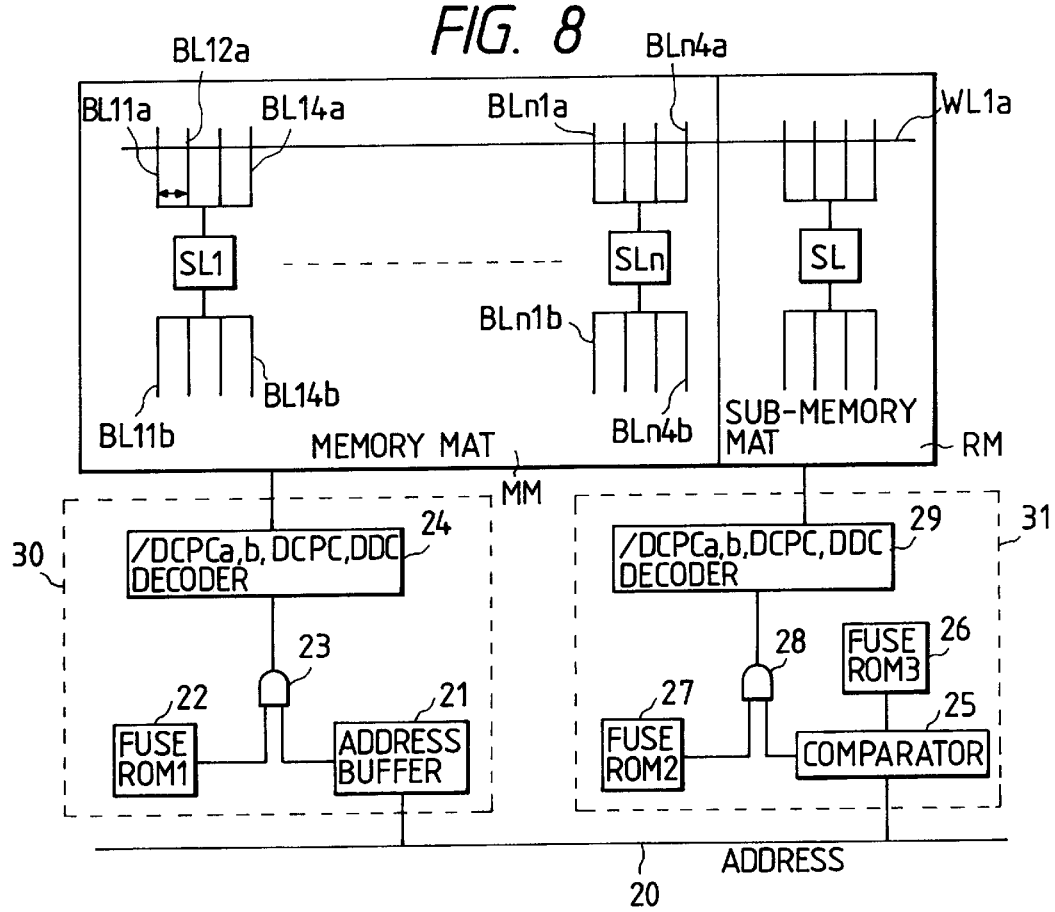
FIG. 8 is a schematic diagram showing how the switching is performed between the memory mat and a block in the spare memory mat in the configuration of FIG. 7(a)

The operation of turning off the four switches in the failed block and replacing the failed block with a block in the spare memory mat RM is explained in detail in conjunction with the schematic configuration diagram of FIG. 8. In FIG. 8, reference numbers 22, 26 and 27 denote fuse ROMs, each of which stores address signals beforehand. An AND circuit 23 drives a decoder 24 when an address signal supplied from the address line 20 into the address buffer 21 and a signal from the fuse ROM 22 agree, thus selecting the block signal lines /DCPCa, /DCPCb, DCPC, DCD corresponding to the address signal. The signal line selection circuit 30 consisting of these circuits 21–24 is provided one for every plural number of blocks in the memory mat MM.

When a failure such as a shortcircuit of bit lines is detected during the inspection of chips on wafer, the four signal lines including the failed bit line /DCPCa, /DCPCb, DCPC, DCD are selected on the spare memory mat RM rather than on the memory mat MM by cutting off a fuse in the fuse ROM 22 for a portion that generates an address signal corresponding to the failed portion, so that the address signal specifying the failed portion, if entered from the address line 20 into the address buffer 21 of the memory mat MM, will not result in the four signal lines of the failed portion /DCPCa, /DCPCb, DCPC, DCD being selected. That is, the four switches of the failed block /DCPCa, /DCPCb, DCPC, DCD are off at all times.

Next, fuses in the fuse ROM 26 for other than the address signals for the block containing the defect are cut off to select a corresponding block in the spare memory mat RM in stead of the failed block in the memory mat MM, and a power supply switch (not shown) for a comparison circuit 25 is turned on to operate the compare circuit. This causes the address signals that select bit lines of the failed block in the memory mat MM to enter from the address line 20 into the compare circuit 25, which produces an output signal if the received address signal agrees with a signal from the fuse ROM 26. When a signal from a fuse ROM 27 and the signal from the compare circuit 25 agree, an AND circuit 28 drives a decoder 29, selecting four signal lines /DCPCa, DCPCB, DCPC, DCD of a block in the spare memory mat RM that corresponds to the address signal, rather than selecting the four signal lines of the failed block in the memory mat MM. Only one such signal line selection circuit 31 comprising these circuits 25–29 needs to be provided because the spare memory mat RM may be small in capacity.

When addresses are specified for the memory cells in a block in the memory mat MM containing defects, four switches—switch DCD, PMOS switch DCPC, NMOS switch /DCPCa and /DCPCb for a block prepared in the spare memory mat RM—are operated to use the block of the spare memory mat RM in place of the failed block, thus correcting defects caused by shortcircuits of bit lines. With this method, when bit lines are short-circuited, it is possible to correct defects in small blocks, each consisting of four pairs of bit lines and one sense & latch circuit, and thereby to increase yield significantly. In this embodiment, the number of bit lines for each sense & latch circuit may be either two or eight or any other number, as in the second embodiment.

Because the first embodiment, too, has four kinds of switches DCD, DCPC, /DCPCa, /DCPCb to repair defects, such as short-circuited bit lines, in blocks as mentioned above, i.e., because the switches DCD1, . . . DCDn to drive and reset the sense & latch circuits, a PMOS switch DCPC to precharge the bit lines, and NMOS switches /DCPC1a, . . . /DCPCna, /DCPC1b, . . . /DCPCnb to discharge the bit lines are provided for each block, it is possible with the first embodiment to perform the DC-based remedy in blocks, as does the third embodiment, and thereby improve yield by providing several spare blocks, each consisting of four sense & latch circuits and four pairs of bit lines sharing the sense & latch circuits, with the word lines shared among the blocks, or by providing a redundant configuration which comprises a spare memory mat using several of n blocks in the banks A and B as spare blocks, and a signal line selection circuit 30 and a switch selection circuit 31, both consisting of fuse ROMs.

The memory array configurations of the foregoing embodiments are AND type memory array configurations. Other configurations can be adopted, such as a NOR type, a DINOR type, and a NAND type described in the Nikkei Microdevice, January 1993, 91st vol. page 59–63. In addition to the flash memory, this invention can also be applied to other nonvolatile memories, such as ferroelectric memory.

Although the above description concerns only preferred embodiments, it is noted that this invention is not limited to these embodiments but that various design modifications may be made without departing from the spirit of the invention.

Effect of the Invention

As can be seen from the foregoing embodiments, this invention divides the memory mat into two banks, turns on the word lines on one bank after the other alternately, and performs the read operation one word line at a time in synchronism with the external clock. This procedure makes it possible to read the information contained in the memory array at high speed and continuously.

One sense & latch circuit is shared by a plurality of bit lines to allow reduction in the bit line pitches, the requirement for the miniaturization of the memory cells and for increasing the memory capacity.

Another feature of this invention is that a set of bit lines and a sense & latch circuit arranged in one of the above configurations is treated as one block; that a switch to control the driving and resetting of the sense & latch circuit, a switch to precharge the bit lines and a switch to discharge the bit lines are provided as DC-based correction switches for substituting a spare memory mat for the failed block; and that the signal selection circuit includes fuse ROMS. This configuration makes it possible to repair a failure caused by an abnormal drop of power supply voltage due to shortcircuits between bit lines, by replacing the entire failed block with a block prepared in the spare memory mat.

We claim:

1. A nonvolatile semiconductor memory device comprising at least:

a plurality of word lines;

a plurality of bit lines;

a memory array comprising a plurality of memory cells arranged at intersections between the word lines and the bit lines and each having a floating gate; and a plurality of amplification and information holding means to amplify and hold signals on the bit lines;

wherein a memory mat including the memory array is divided into a first bank and a second bank, and bit lines belonging to the first bank and the bit lines belong to the second bank combine to form pairs of bit lines so that each pair of bit lines shares one of the amplification and information holding means, and switch means are provided which selectively control blocks, each of which comprises a predetermined number of the bit line pairs and the same number of amplification and information holding means as that of the bit line pairs, wherein the switch means to selectively control the blocks comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time.

2. A nonvolatile semiconductor memory device according to claim 1, wherein each of the banks has first and second sub-input/output lines connected parallelly to output amplification and information holding means through switch means that operate at a cycle two times that of an external clock, the output amplification and information holding means are connected to the output line of each bank through an output switching means that operates half-cycle out of phase with the external clock, the first sub-input/output line of each bank is parallelly connected to a first set of amplification and information holding means of each block through switching means that operate in synchronism with the external clock, and the second sub-input/output line is parallelly connected to a second set of amplification and information holding means of each block through switching means that operate in synchronism with the external clock.

3. A nonvolatile semiconductor memory device according to claim 2, wherein, at the same time that information of memory cells connected to one word line which is stored in the first set of the amplification and information holding means connected to the first sub-input/output line is output from the output line of the bank through the output amplification and information holding means, information of memory cells connected to the same word line which is stored in the second set of amplification and information holding means connected to the second sub-input/output line is saved in the output amplification and information holding means.

4. A nonvolatile semiconductor memory device according to claim 2 or 3, wherein the first set of amplification and information holding means is a set of odd-numbered amplification and information holding means in each block, and the second set of amplification and information holding means is a set of even-numbered amplification and information holding means in each block.

5. A nonvolatile semiconductor memory device according to claim 3, wherein while the information of memory cells connected to a word line in one bank is output from the output line for the bank, a word line for the other bank is selected.

6. A nonvolatile semiconductor memory device according to claim 3, wherein the operation is performed in synchronism with the external clock signal.

7. A nonvolatile semiconductor memory device comprising at least:
a plurality of word lines;
a plurality of bit lines;
a memory array comprising a plurality of memory cells arranged at intersections between the word lines and the bit lines and each having a floating gate; and
a plurality of amplification and information holding means to amplify and hold signals on the bit lines;
wherein a memory mat including the memory array is divided into a read side memory mat and a reference mat, the bit lines belonging to the read side memory mat and the bit lines belonging to the reference mat combine to form pairs of bit lines, and switching means are provided which selectively control blocks, each of which comprises a plurality of the bit line pairs and one amplification and information holding means.

8. A nonvolatile semiconductor memory device according to claim 7, wherein the switching means to selectively control the blocks comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time.

9. A nonvolatile semiconductor memory device according to claim 1, wherein a first signal selection means is provided one for every two or more blocks to selectively cut off the selective block control switching means belonging to a block that has a conduction failure with bit lines due to faulty connection or foreign matters.

10. A nonvolatile semiconductor memory device according to claim 9, further comprising a spare memory mat which has word lines commonly connected to the word lines of the first and second banks, and a second signal line selection means which selects the switching means that selectively control blocks in the spare memory mat, each block comprising a plurality of bit line pairs and the same number of amplification and information holding means as that of the bit line pairs.

11. A nonvolatile semiconductor memory device according to claim 9, further comprising a spare memory mat which has word lines commonly connected to the word lines of the read side memory mat and the reference mat, and a second signal line selection means which selects the switching means that selectively control blocks in the spare memory mat, each block comprising a plurality of bit line pairs and one amplification and information holding means.

12. A nonvolatile semiconductor memory device according to claim 10 or 11, wherein the switch means to selectively control the blocks in the spare memory mat comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time.

13. A nonvolatile semiconductor memory device according to claim 7, wherein a first signal selection means is provided one for every two or more blocks to selectively cut off the selective block control switching means belonging to a block that has a conduction failure with bit lines due to faulty connection or foreign matters.

14. A nonvolatile semiconductor memory device comprising at least:
a plurality of word lines;
a plurality of bit lines;
a memory array comprising a plurality of memory cells arranged at intersections between the word lines and the bit lines and each having a floating gate; and
a plurality of amplification and information holding means to amplify and hold signals on the bit lines;

wherein a memory mat including the memory array is divided into a first bank and a second bank, and bit lines belonging to the first bank and the bit lines belong to the second bank combine to form pairs of bit lines so that each pair of bit lines shares one of the amplification and information holding means, and switch means are provided which selectively control blocks, each of which comprises a predetermined number of the bit line pairs and the same number of amplification and information holding means as that of the bit line pairs, wherein the switch means to selectively control the blocks comprise: switches to selectively control circuits, one block at a time, that are connected to a power supply line to supply an electric charge to the bit lines for precharging; switches to selectively discharge the bit lines one block at a time; and switches to selectively turn on or off the power supply of the amplification and information holding means one block at a time;

wherein each of the banks has first and second sub-input/output lines connected parallelly to output amplification and information holding means through switch means that operate at a cycle two times that of an external clock, the output amplification and information holding means are connected to the output line of each bank through an output switching means that operates a half-cycle out of phase with the external clock, the first sub-input/output line of each bank is parallelly connected to a first set of amplification and information holding means of each block through switching means that operate in synchronism with the external clock, and the second sub-input/output line is parallelly connected to a second set of amplification and information holding means of each block through switching means that operate in synchronism with the external clock.

15. The nonvolatile semiconductor memory device according to claim 14, wherein, at the same time that information of memory cells connected to one word line which is stored in the first set of the amplification and information holding means connected to the first sub-input/output line is output from the output line of the bank through the output amplification and information holding means, information of memory cells connected to the same word line which is stored in the second set of amplification and information holding means connected to the second sub-input/output line is saved in the output amplification and information holding means.

16. The nonvolatile semiconductor memory device according to claim 14 or claim 15, wherein the first set of amplification and information holding means is a set of odd-numbered amplification and information holding means in each block, and the second set of amplification and information holding means is a set of even-numbered amplification and information holding means in each block.

17. The nonvolatile semiconductor memory device according to claim 4, wherein while the information of memory cells connected to a word line in one bank is output from the output line for the bank, a word line for the other bank is selected.

18. The nonvolatile semiconductor memory device according to claim 4, wherein the operation is performed in synchronism with the external clock signal.

19. The nonvolatile semiconductor memory device according to claim 6, wherein the operation is performed in synchronism with the external clock signal.

20. The nonvolatile semiconductor memory device according to claim 14, wherein the first set of amplification and information holding means is a set of odd-numbered amplification and information holding means in each block, and the second set of amplification and information holding means is a set of even-numbered amplification and information holding means in each block.

21. The nonvolatile semiconductor memory device according to claim 20, wherein while the information of memory cells connected to a word line in one bank is output from the output line for the bank, a word line for the other bank is selected.

22. The nonvolatile semiconductor memory device according to claim 21, wherein the operation is performed in synchronism with the external clock signal.

* * * * *